(12) United States Patent
Hashizume

(10) Patent No.: US 10,721,446 B2
(45) Date of Patent: Jul. 21, 2020

(54) WAVELENGTH CONVERSION ELEMENT, LIGHT SOURCE APPARATUS, AND PROJECTOR

(71) Applicant: SEIKO EPSON CORPORATION, Tokyo (JP)

(72) Inventor: Toshiaki Hashizume, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/122,066

(22) Filed: Sep. 5, 2018

(65) Prior Publication Data

US 2019/0075276 A1 Mar. 7, 2019

(30) Foreign Application Priority Data

Sep. 6, 2017 (JP) .................. 2017-170934

(51) Int. Cl.
*G03B 21/20* (2006.01)
*H04N 9/31* (2006.01)
(Continued)

(52) U.S. Cl.
CPC ........... *H04N 9/3138* (2013.01); *C09K 11/02* (2013.01); *C09K 11/7774* (2013.01); *G02B 5/0242* (2013.01); *G02B 26/008* (2013.01); *G02B 27/0972* (2013.01); *G03B 21/204* (2013.01); *H01S 5/0609* (2013.01); *H04N 9/3105* (2013.01); *H04N 9/3158* (2013.01); *H04N 9/3161* (2013.01); *H04N 9/3164* (2013.01);
(Continued)

(58) Field of Classification Search
CPC .. H04N 9/3138; C09K 11/02; C09K 11/7774; G02B 27/0972; G03B 21/204; G03B 21/006; H01S 5/0609
See application file for complete search history.

(56) References Cited

U.S. PATENT DOCUMENTS 4,486,486 A * 12/1984 Maeoka .................. G21K 4/00
250/483.1
2009/0278147 A1 11/2009 Suzuki
(Continued)

FOREIGN PATENT DOCUMENTS

JP 2004-088013 A 3/2004
JP 6075712 B2 2/2017
WO 2007/080803 A1 7/2007

*Primary Examiner* — Michelle M Iacoletti
*Assistant Examiner* — Magda Cruz
(74) *Attorney, Agent, or Firm* — Oliff PLC

(57) ABSTRACT

A wavelength conversion element includes a wavelength conversion layer having a first surface on which excitation light is incident, a second surface located on the side opposite the first surface, a plurality of phosphor particles that convert the excitation light in terms of wavelength to produce fluorescence, and a binder that holds the plurality of phosphor particles. The plurality of phosphor particles have a particle diameter distribution, and the minimum particle diameter in the particle diameter distribution of a plurality of the phosphor particles contained in a first region located on the side facing the first surface is greater than the minimum particle diameter in the particle diameter distribution of a plurality of the phosphor particles contained in a second region located on the side facing the second surface.

8 Claims, 4 Drawing Sheets

(51) Int. Cl.
*G02B 27/09* (2006.01)
*G02B 5/02* (2006.01)
*G03B 21/00* (2006.01)
*G02B 27/14* (2006.01)
*G02B 27/10* (2006.01)
*H01S 5/06* (2006.01)
*C09K 11/77* (2006.01)
*C09K 11/02* (2006.01)
*G02B 26/00* (2006.01)

(52) U.S. Cl.
CPC ........ *G02B 27/1006* (2013.01); *G02B 27/141* (2013.01); *G03B 21/006* (2013.01)

(56) References Cited

U.S. PATENT DOCUMENTS

| | | | |
|---|---|---|---|
| 2013/0201458 A1* | 8/2013 | Kashiwagi | H05B 33/00 353/85 |
| 2013/0229634 A1* | 9/2013 | Hu | F21V 9/38 353/84 |
| 2016/0149097 A1* | 5/2016 | Saka | C23C 16/4417 257/98 |
| 2016/0238922 A1* | 8/2016 | Furuyama | G03B 21/204 |
| 2017/0023188 A1* | 1/2017 | Mima | F21K 9/64 |
| 2017/0045732 A1* | 2/2017 | Chang | G02B 26/008 |
| 2017/0227192 A1* | 8/2017 | Ikeda | F21V 29/89 |
| 2017/0307163 A1* | 10/2017 | Nagasaki | F21S 41/16 |
| 2017/0307968 A1* | 10/2017 | Nagasaki | F21S 41/143 |

\* cited by examiner

WAVELENGTH CONVERSION ELEMENT, LIGHT SOURCE APPARATUS, AND PROJECTOR

BACKGROUND

1. Technical Field

The present invention relates to a wavelength conversion element, a light source apparatus, and a projector.

2. Related Art

As a light source apparatus used in a projector, there is a proposed light source apparatus using fluorescence emitted from a phosphor irradiated with excitation light outputted from a light emitting device, such as a semiconductor laser.

For example, Japanese Patent No. 6,075,712 discloses a light emitting device including a phosphor made of a bulk crystal and having a configuration in which a plurality of scatterers for scattering fluorescence are dispersed in the phosphor. In the light emitting device shown by way of example in Japanese Patent No. 6,075,712, the density of the scatterers on the side on which excitation light is incident is lower than the density of the scatterers on the side where a reflection layer is formed.

In the phosphor described in Japanese Patent No. 6,075,712, since a plurality of scatterers are present in the vicinity of the surface on which the excitation light is incident, backscattered light hardly contributes to generation of the fluorescence but causes a decrease in wavelength conversion efficiency. Further, in the case where a plurality of scatterers are present in the vicinity of the surface on which the excitation light is incident, the ratio of generated fluorescence reabsorbed by the phosphor is increased, resulting in a decrease in fluorescence extraction efficiency. It is therefore difficult for the light emitting device of related art to improve both the wavelength conversion efficiency and the fluorescence extraction efficiency to produce high-intensity fluorescence.

SUMMARY

An advantage of some aspects of the invention is to provide a wavelength conversion element that produces high-intensity fluorescence. Another advantage of some aspects of the invention is to provide a light source apparatus including the wavelength conversion element. Another advantage of some aspects of the invention is to provide a projector including the light source apparatus.

A wavelength conversion element according to an aspect of the invention includes a wavelength conversion layer having a first surface on which excitation light is incident, a second surface located on a side opposite the first surface, a plurality of phosphor particles that convert the excitation light in terms of wavelength to produce fluorescence, and a binder that holds the plurality of phosphor particles. The plurality of phosphor particles have a particle diameter distribution, and a minimum particle diameter in the particle diameter distribution of a plurality of the phosphor particles contained in a first region located on a side facing the first surface is greater than a minimum particle diameter in the particle diameter distribution of a plurality of the phosphor particles contained in a second region located on a side facing the second surface.

In the present specification, an interface between two substances having refractive indices different from each other is referred to as a refractive index interface. In general, since the refractive index of the phosphor particles differs from the refractive index of the binder, the surface of each of the phosphor particles surrounded by the binder, that is, the surface where each of the phosphor particles is in contact with the binder is the refractive index interface.

In the wavelength conversion element according to the aspect of the invention, since the minimum particle diameter of the plurality of phosphor particles contained in the first region, which is located on the side facing the first surface on which the excitation light is incident, is greater than the minimum particle diameter of the plurality of phosphor particles contained in the second region located on the side facing the second surface, the total surface area of the plurality of phosphor particles in the first region is smaller than the total surface area of the plurality of phosphor particles in the second region. That is, the area of the refractive index interface per unit volume in the first region is smaller than the area of the refractive index interface per unit volume in the second region. The amount of backscattered excitation light in the vicinity of the first surface on which the excitation light is incident and the amount of reabsorbed fluorescence are both therefore reduced. The wavelength conversion element according to the aspect of the invention can therefore produce high-intensity fluorescence.

In the wavelength conversion element according to the aspect of the invention, a reflection section that reflects the fluorescence may be so provided as to face the second surface.

According to the configuration described above, a reflective wavelength conversion element capable of producing high-intensity fluorescence can be provided.

A light source apparatus according to another aspect of the invention includes the wavelength conversion element according to the aspect of the invention described above and an excitation light source that outputs the excitation light.

According to an aspect of the invention, in which the wavelength conversion element according to the aspect of the invention described above is provided, a light source apparatus that produces high-intensity output light can be provided.

A projector according to another aspect of the invention includes the light source apparatus according to the aspect of the invention aforementioned, a light modulator that modulates light from the light source apparatus in accordance with image information to form image light, and a projection optical apparatus that projects the image light.

According to an aspect of the invention, in which the light source apparatus according to the aspect of the invention is provided, a projector that projects light having a high luminous flux can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will be described below with reference to the drawings.

In the following drawings, components are drawn at different dimensional scales in some cases for clarity of each of the components.

An example of a projector according to the present embodiment will be described.

The projector according to the present embodiment is a projection-type image display apparatus that displays a color image on a screen (projection surface). The projector includes three liquid crystal light modulators corresponding to red light, green light and blue light. The projector further includes a semiconductor laser, which produces high-luminance, high-power light, as a light source of an illuminator.

Figure 1:
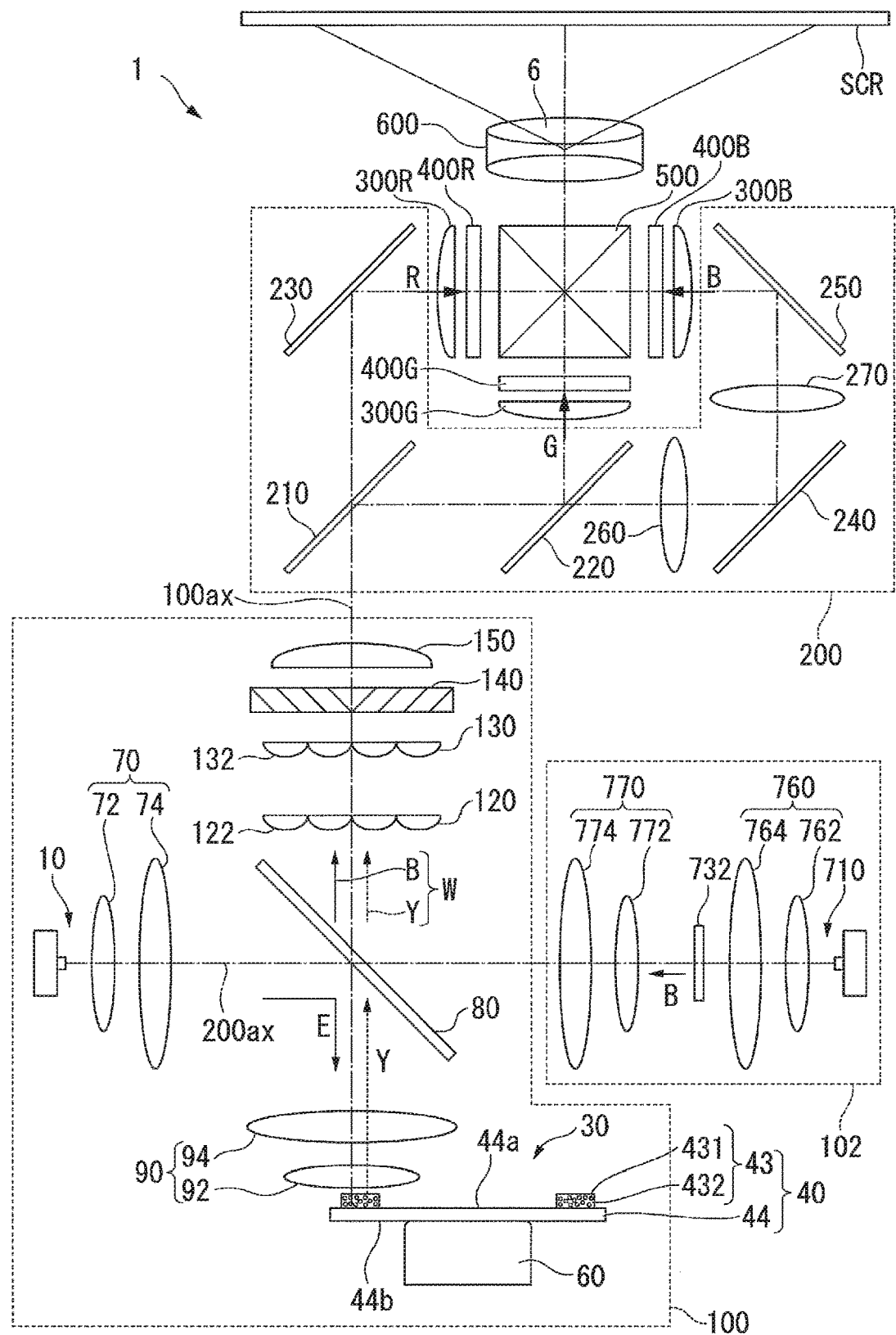
FIG. 1 is a schematic configuration diagram of a projector according to an embodiment of the invention.

FIG. 1 is a schematic configuration diagram showing the optical system of the projector according to present embodiment.

A projector 1 includes a first light source apparatus 100, a second light source apparatus 102, a color separation/light guide system 200, a liquid crystal light modulator 400R, a liquid crystal light modulator 400G, a liquid crystal light modulator 400B, a cross dichroic prism 500, and a projection optical apparatus 600, as shown in FIG. 1.

The first light source apparatus 100 in the present embodiment corresponds to the light source apparatus in the appended claims.

The first light source apparatus 100 includes a first light source 10, a collimation system 70, a dichroic mirror 80, a collimation/light collection system 90, a wavelength converter 30, a first lens array 120, a second lens array 130, a polarization conversion element 140, and a superimposing lens 150.

The first light source 10 in the present embodiment corresponds to the excitation light source in the appended claims.

The first light source 10 is formed of a semiconductor laser that outputs blue excitation light E having an emitted light intensity that peaks, for example, at 445 nm. The first light source 10 may be formed of a single semiconductor laser or a plurality of semiconductor lasers. The first light source 10 may instead be formed of a semiconductor laser that outputs blue excitation light having an emitted light intensity that peaks at a wavelength other than 445 nm, for example, 460 nm. The first light source 10 is so disposed that the optical axis 200ax of the excitation light E outputted from the first light source 10 is perpendicular to an illumination optical axis 100ax.

The collimation system 70 includes a first lens 72 and a second lens 74. The collimation system 70 roughly parallelizes the light outputted from the first light source 10. The first lens 72 and the second lens 74 are each formed of a convex lens.

The dichroic mirror 80 is so disposed in the optical path from the collimation system 70 to the collimation/light collection system 90 as to incline by 45° with respect to each of the optical axis 200ax and the illumination optical axis 100ax. The dichroic mirror 80 reflects the blue excitation light E outputted from the first light source 10 and transmits yellow fluorescence Y outputted from the wavelength converter 30, which will be described later.

The collimation/light collection system 90 has the function of focusing the excitation light E reflected off the dichroic mirror 80 and causing the focused excitation light E to be incident on a wavelength conversion element 40, which will be described later, and the function of roughly parallelizing the fluorescence Y outputted from the wavelength conversion element 40 and causing the roughly parallelized fluorescence Y to be incident on the dichroic mirror 80. The collimation/light collection system 90 includes a first lens 92 and the second lens 94. The first lens 92 and the second lens 94 are each formed of a convex lens.

The second light source apparatus 102 includes a second light source 710, a light collection system 760, a diffuser plate 732, and a collimation system 770.

The second light source 710 is formed of a semiconductor laser identical to the semiconductor laser that forms the first light source 10. In the case where the first light source apparatus 100 is formed of a semiconductor laser that outputs light having an emitted light intensity that peaks at the wavelength of 445 nm, the second light source 710 may be formed of a semiconductor laser that outputs light having an emitted light intensity that peaks at the wavelength of 460 nm. The second light source 710 may be formed of a single semiconductor laser or a plurality of semiconductor lasers.

The collimation system 760 includes a first lens 762 and a second lens 764. The collimation system 760 collects blue light B outputted from the second light source on the diffuser plate 732 or in the vicinity thereof. The first lens 762 and the second lens 764 are each formed of a convex lens.

The diffuser plate 732 diffuses the blue light B from the second light source 710 to produce blue light B having a light orientation distribution close to the light orientation distribution of the fluorescence Y emitted from the wavelength converter 30. The diffuser plate 732 can, for example, be a ground glass plate made of optical glass.

The collimation system 770 includes a first lens 772 and a second lens 774. The collimation system 770 roughly parallelizes the diffused light having exited out of the diffuser plate 732. The first lens 772 and the second lens 774 are each formed of a convex lens.

The blue light B outputted from the second light source apparatus 102 is reflected off the dichroic mirror 80 and combined with the fluorescence Y having passed through the dichroic mirror 80 into white light W. The white light W is incident on the first lens array 120.

The first lens array 120 includes a plurality of first lenses 122 for dividing the light from the dichroic mirror 80 into a plurality of sub-light fluxes. The plurality of first lenses 122 are arranged in a matrix in a plane perpendicular to the illumination optical axis 100ax.

The second lens array 130 includes a plurality of second lenses 132 corresponding to the plurality of first lenses 122 of the first lens array 120. The second lens array 130, along with the downstream superimposing lens 150, forms images of the first lenses 122 of the first lens array 120 in the vicinity of an image formation region of each of the liquid crystal light modulators 400R, 400G, and 400B. The plurality of second lenses 132 are arranged in a matrix in a plane perpendicular to the illumination optical axis 100ax.

The polarization conversion element 140 converts the divided sub-light fluxes from the first lens array 120 into linearly polarized light fluxes having an aligned polarization direction. The polarization conversion element 140 includes, although not shown, polarization separation layers, reflection layers, and retardation layers.

The superimposing lens 150 collects the sub-light fluxes having exited out of the polarization conversion element 140 and superimposes the collected sub-light fluxes on one another in the vicinity of the image formation region of each of the liquid crystal light modulators 400R, 400G, and 400B. The first lens array 120, the second lens array 130, and the superimposing lens 150 form an optical integration system that homogenizes the in-plane optical intensity distribution of the light from the wavelength converter 30.

The color separation/light guide system 200 includes a dichroic mirror 210, a dichroic mirror 220, a reflection mirror 230, a reflection mirror 240, a reflection mirror 250, a relay lens 260, and a relay lens 270. The color separation/light guide system 200 separates the white light W produced from the light from the first light source apparatus 100 and the light from the second light source apparatus 102 into red light R, green light G, and blue light B and guides the red light R, the green light G, and the blue light B to the corresponding liquid crystal light modulators 400R, 400G, and 400B.

A field lens 300R is disposed between the color separation/light guide system 200 and the liquid crystal light modulator 400R. A field lens 300G is disposed between the color separation/light guide system 200 and the liquid crystal light modulator 400G. A field lens 300B is disposed between the color separation/light guide system 200 and the liquid crystal light modulator 400B.

The dichroic mirror 210 is a dichroic mirror that transmits a red light component and reflects a green light component and a blue light component. The dichroic mirror 220 is a dichroic mirror that reflects the green light component and transmits the blue light component. The reflection mirror 230 is a reflection mirror that reflects the red light component. The reflection mirrors 240 and 250 are reflection mirrors that reflect the blue light component.

The red light R having passed through the dichroic mirror 210 is reflected off the reflection mirror 230, passes through the field lens 300R, and is incident on the image formation region of the liquid crystal light modulator 400R. The green light G reflected off the dichroic mirror 210 is reflected off the dichroic mirror 220, passes through the field lens 300G, and is incident on the image formation region of the liquid crystal light modulator 400G. The blue light B having passed through the dichroic mirror 220 travels via the relay lens 260, the light-incident-side reflection mirror 240, the relay lens 270, the light-exiting-side reflection mirror 250, and the field lens 300B, and is incident on the image formation region of the liquid crystal light modulator 400B.

The liquid crystal light modulators 400R, 400G, and 400B each modulate the color light incident thereon in accordance with image information to form a color image corresponding to the color light. Although not shown, light-incident-side polarizers are disposed on the light incident side of the liquid crystal light modulators 400R, 400G, and 400B. Light-exiting-side polarizers are disposed on the light exiting side of the liquid crystal light modulators 400R, 400G, and 400B.

The cross dichroic prism 500 combines the image light fluxes outputted from the liquid crystal light modulators 400R, 400G, and 400B with one another to form a color image. The cross dichroic prism 500 is formed by bonding four rectangular prisms to each other, and dielectric multi-layer films are formed on the roughly X-letter-shaped interfaces between the bonded rectangular prisms.

The color image having exited out of the cross dichroic prism 500 is enlarged and projected by the projection optical apparatus 600 and forms an image on a screen SCR. The projection optical apparatus 600 is formed of a plurality of projection lenses 6.

The wavelength converter 30 will be described below in detail.

Figure 2:
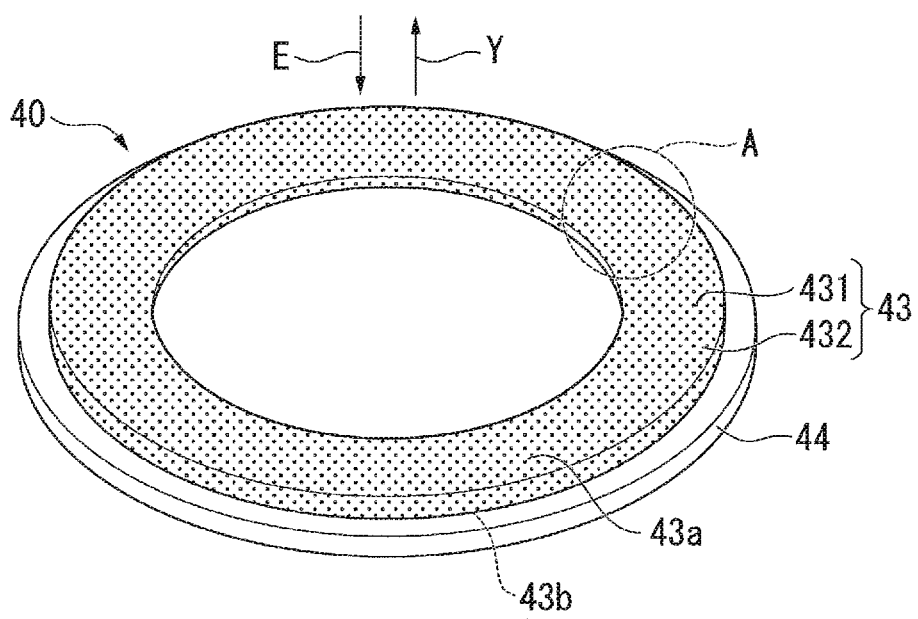
FIG. 2 is a perspective view of a wavelength conversion element in the present embodiment.

FIG. 2 is a perspective view of the wavelength conversion element 40.

The wavelength converter 30 includes the wavelength conversion element 40 and a motor 60, as shown in FIGS. 1 and 2. The wavelength conversion element 40 includes a wavelength conversion layer 43 and a substrate 44. The wavelength conversion element 40 outputs the fluorescence Y toward the side on which the excitation light E is incident. The substrate 44 functions as a reflector that reflects the fluorescence Y outputted from the wavelength conversion layer 43 toward the substrate 44. That is, the wavelength conversion element 40 in the present embodiment is a reflective wavelength conversion element. The wavelength conversion element 40 may include a bonding layer (not shown) that bonds the wavelength conversion layer 43 to the substrate 44.

The wavelength conversion layer 43 is formed of a phosphor layer that is excited with the excitation light E outputted from the first light source 10 and outputs the yellow fluorescence Y. The wavelength conversion layer 43 contains a plurality of phosphor particles 431 and a binder 432, which holds the plurality of phosphor particles 431. The binder 432 is made, for example, of glass. The phosphor particles 431 are made of a YAG-based phosphor made of $(Y,GD)_3(Al,Ga)_5O_{12}(YAG:Ce)$, in which Ce is dispersed as an activator. Out of the surfaces of the wavelength conversion layer 43, the surface on which the excitation light E is incident is referred to as a first surface 43a, and the surface opposite the first surface 43a is referred to as a second surface 43b.

That is, the wavelength conversion layer 43 has the first surface 43a, on which the excitation light E is incident, the second surface 43b, which is located on the side opposite the first surface 43a, the plurality of phosphor particles 431, which convert the excitation light E in terms of wavelength into the fluorescence Y, and the binder 432, which holds the plurality of phosphor particles 431.

As an example, the phosphor particles 431 has a configuration in which Ce ions having a molar concentration ranging from 0.3 to 2% are added as an activator to the YAG material. The wavelength conversion layer 43 has a configuration in which the binder 432 contains the phosphor particles 431 described above at a percent volume concentration ranging from 50 to 75%. The binder 432 is primarily made, for example, of borosilicate glass. The refractive index of the binder 432 is lower than the refractive index of the phosphor particles 431 (YAG:Ce). The wavelength conversion layer 43 is formed in an annular shape, as shown in FIG. 2. The wavelength conversion layer 43 has a thickness ranging, for example, from 40 to 200 μm.

The wavelength conversion layer 43 is not necessarily made of a YAG-based phosphor but is desirably made of a garnet-based phosphor. A garnet-based phosphor has thermal conductivity higher than that of any other phosphor and has high reliability in a high temperature environment. A garnet-based phosphor therefore emits high-power fluorescence even in a case where it is used in a light source apparatus including a stationary wavelength conversion element in place of a rotating-wheel wavelength conversion element.

Figure 3:
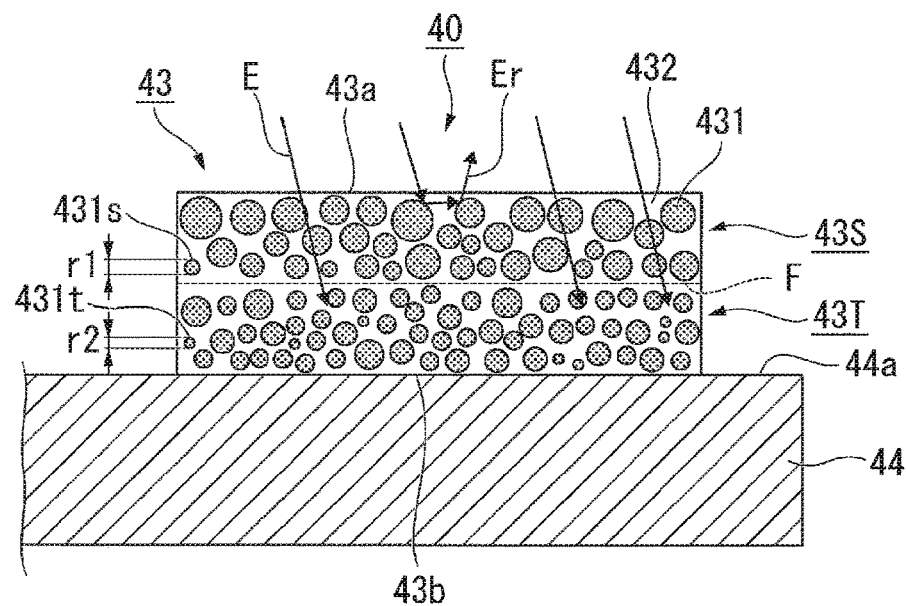
FIG. 3 is a cross-sectional view of the wavelength conversion element.

FIG. 3 is an enlarged cross-sectional view of a portion of the wavelength conversion element 40 that is the portion labeled with the reference character A in FIG. 2.

The wavelength conversion layer 43 has a first region 43S, which is located on the side facing the first surface 43a, and a second region 43T, which is located on the side facing the second surface 43b, as shown in FIG. 3. In FIG. 3, the boundary line between the first region 43S and the second region 43T is drawn with the broken line F for ease of description. It is, however, noted that a clear boundary line F may or may not be present between the first region 43S and the second region 43T in the actual wavelength conversion layer 43. Further, the first region 43S and the second region 43T do not each necessarily have a specific thickness. In any case, the same binder 432 is used in both the first region 43S and the second region 43T, and the first region 43S and the second region 43T form an integrated single layer.

Figure 5:
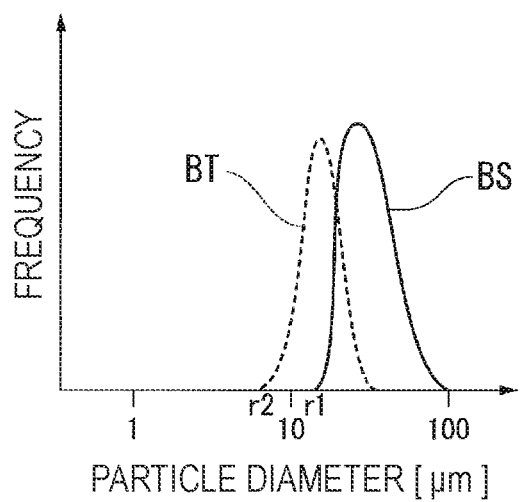
FIG. 5 shows the distribution of the particle diameter of phosphor particles in the wavelength conversion layer in the present embodiment.

FIG. 5 shows an example of the distribution of the particle diameter of the phosphor particles 431 in the wavelength conversion layer 43.

The horizontal axis of FIG. 5 represents the particle diameter [μm] of the individual phosphor particles 431, and the vertical axis of FIG. 5 represents the frequency of each particle diameter. A curve BS (solid line) represents the distribution of the particle diameter of the phosphor particles 431 in the first region 43S, and a curve BT (broken line) represents the distribution of the particle diameter of the phosphor particles 431 in the second region 43T.

The plurality of phosphor particles 431 have a particle diameter distribution across the wavelength conversion layer 43, as shown in FIG. 5. In the particle diameter distribution, the frequency peaks, for example, at a value ranging from 20 to 30 μm, and the width of the distribution ranges from several to 100 micrometers. The plurality of phosphor particles 431 have a particle diameter distribution each in the first region 43S and the second region 43T. The particle diameter distribution BS of the phosphor particles 431 in the first region 43S differs from the particle diameter distribution BT of the phosphor particles 431 in the second region 43T in that the phosphor particles 431 in the first region 43S have larger particle diameters.

The particle diameter distributions BS and BT overlap with each other in such away that the minimum particle diameter r1 of the plurality of phosphor particles 431 contained in the first region 43S is greater than the minimum particle diameter r2 of the plurality of phosphor particles 431 contained in the second region 43T. That is, let r1 be the particle diameter of phosphor particles 431s having the minimum diameter in the first region 43S, and r2 be the particle diameter of phosphor particles 431t having the minimum diameter in the second region 43T, and the particle diameters r1 and r2 satisfy r1>r2.

The substrate 44 is provided on the second surface 43b of the wavelength conversion layer 43. The substrate 44 is formed, for example, of a disc-shaped member made of a material having high thermal conductivity, such as aluminum and copper. The thus formed substrate 44 can provide high heat dissipation capability. The substrate 44 functions as a reflector that reflects the fluorescence Y outputted from the wavelength conversion layer 43 toward the substrate 44, as described above. In other words, the substrate 44, which functions as a reflection section that reflects the fluorescence Y, is provided on the second surface 43b of the wavelength conversion layer 43. A reflection layer made, for example, of a metal having high reflectance may be separately provided on the second surface 43b of the wavelength conversion layer 43 or a first surface 44a of the substrate 44.

In the case where the bonding layer is used, the bonding layer is interposed between the substrate 44 (first surface 44a of substrate 44) and the wavelength conversion layer 43 (second surface 43b of wavelength conversion layer 43) and bonds the substrate 44 and the wavelength conversion layer 43 to each other. The bonding layer is, for example, a highly thermally conductive adhesive made of a resin mixed with highly thermally conductive fine particles. The thus configured bonding layer can efficiently transfer heat in the wavelength conversion layer 43 to the substrate 44.

The motor 60 (see FIG. 1) rotates the wavelength conversion element 40 around an axis of rotation perpendicular to the first surface 44a of the substrate 44 or a second surface 44b of the substrate 44, which is the surface opposite the first surface 44a. In the present embodiment, rotating the wavelength conversion element 40 allows the position where the excitation light E is incident on the wavelength conversion layer 43 to change with time. The rotation of the wavelength conversion element 40 avoids a situation in which the excitation light E keeps impinging on the same location on the wavelength conversion layer 43 so that the wavelength conversion layer 43 is locally heated and therefore degraded.

An example of a method for manufacturing the wavelength conversion element 40 will be described below.

A plurality of phosphor particles having a particle diameter distribution ranging from several to 100 micrometers are first prepared.

A sieve having a predetermined mesh size is then used to classify the plurality of phosphor particles into a group primarily containing phosphor particles having relatively large particle diameters (phosphor particles having been left on sieve) and a group primarily containing phosphor particles having relatively small particle diameters (phosphor having fallen through sieve) (classification step).

In a case where a sieve is used to classify the phosphor particles and a particle diameter corresponding to the mesh size of the sieve is defined as a reference particle diameter, phosphor particles having particle diameters greater than the reference particle diameter and phosphor particles having particle diameters smaller than the reference particle diameter are not completely separated from each other. The particle diameter distribution of the phosphor particles having been left on the sieve and the particle diameter distribution of the phosphor particles having fallen through the sieve overlap with each other, as shown in FIG. 5. The classification can, however, be performed satisfactorily enough to allow the minimum particle diameter of the plurality of phosphor particles having larger particle diameters to be greater than the minimum particle diameter of the plurality of phosphor particles having smaller particle diameters.

The plurality of phosphor particles in each of the separated groups are then mixed with a binder material, such as borosilicate glass, to produce two types of wavelength conversion layer materials containing the phosphor particles that differ from each other in terms of the particle diameter distribution (step of producing wavelength conversion layer material).

The wavelength conversion layer material containing the phosphor particles having the relatively small particle diameters is then annularly applied onto a substrate, made, for example, of aluminum, and the wavelength conversion layer material containing the phosphor particles having the relatively large particle diameters is next applied onto the layer having already been applied on the substrate (application step).

The two-layer wavelength conversion layer materials produced in the preceding step is then burned to integrate the two layers with each other to form the wavelength conversion layer (burning step).

The wavelength conversion element 40 in the present embodiment is thus completed after the steps described above.

A description will be made of problems with the related art and effects and advantages of the wavelength conversion element 40 according to the present embodiment.

Figure 4:
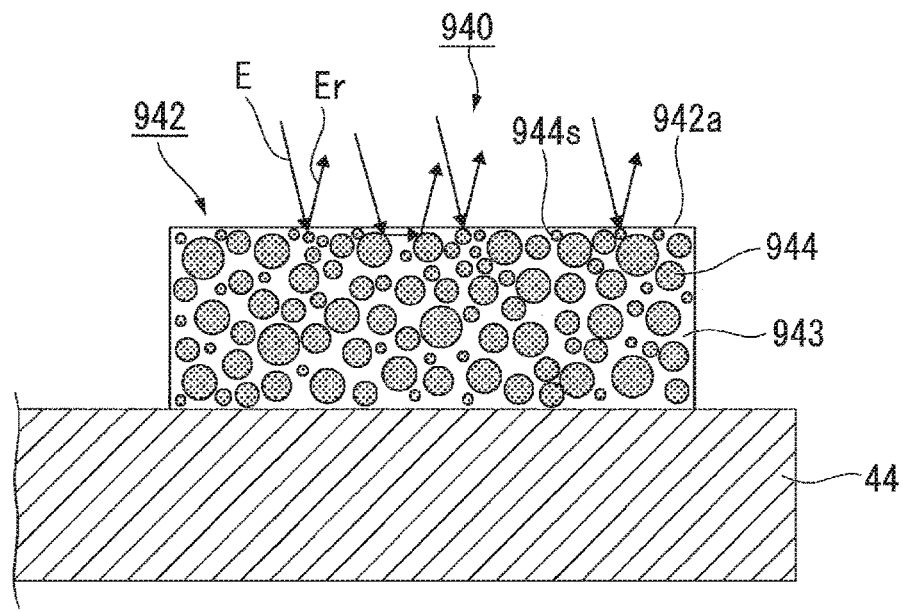
FIG. 4 is a cross-sectional view of a wavelength conversion element of related art.

FIG. 4 is a cross-sectional view of a wavelength conversion element of the related art.

In a wavelength conversion element 940 of the related art, a plurality of phosphor particles 944 having a particle diameter distribution are uniformly dispersed in a binder 943 of a wavelength conversion layer 942, as shown in FIG. 4. Therefore, phosphor particles 944 having a specific particle diameter distribution are not present in a specific region of the wavelength conversion layer 942, and phosphor particles 944s, which have small particle diameters, are also present in a region close to a first surface 942a of the wavelength conversion layer 942.

When the excitation light E is incident on the first surface 942a, the excitation light E is reflected off the refractive index interface between the phosphor particles 944 and the binder 943 by a larger number of times than in the wavelength conversion element 40 according to the present embodiment because a large number of refractive index interfaces are present in a region close to the first surface 942a. The ratio of excitation light Er, which is backscattered and is therefore not absorbed by the phosphor particles 944, to the excitation light E therefore increases. The backscattered excitation light Er therefore hardly contributes to the generation of the fluorescence, causing a decrease in the wavelength conversion efficiency.

Further, the fluorescence produced with the aid of the activator, such as the Ce ions, in each of the phosphor particles having small particle diameters is reflected in the wavelength conversion layer by a larger number of times than the fluorescence produced in each of the phosphor particles having large particle diameters. A phenomenon in which the fluorescence repeatedly reflected in the wavelength conversion layer is reabsorbed by the activator therefore occurs. The phenomenon results from the fact that the absorption spectrum and the fluorescence spectrum of the phosphor overlap with each other. That is, when phosphor particles have small particle diameters, a large number of refractive index interface are present. Therefore, the fluorescence is repeatedly reflected, and the probability of incidence of the fluorescence on the activator increases. Further, the fluorescence is absorbed by the surface of a phosphor particle by a greater amount than by other substances. The two reasons described above are believed to be the cause of the reabsorption of the fluorescence. In the case of the wavelength conversion element 940 of the related art, the fluorescence extraction efficiency decreases because the fluorescence is reabsorbed as described above.

As described above, it is difficult for the wavelength conversion element 940 of the related art to improve both the excitation light conversion efficiency and the fluorescence extraction efficiency to produce high-intensity fluorescence.

In contrast, in the wavelength conversion element 40 according to the present embodiment, the particle diameter distribution of the phosphor particles 431 in the wavelength conversion layer 43 differs between the first region 43S, on which the excitation light E is incident, and the second region 43T, which is located on the side opposite the first region 43S. Specifically, the minimum particle diameter r1 of the phosphor particles 431 in the first region 43S is greater than the minimum particle diameter r2 of the phosphor particles 431 in the second region 43T. In other words, in the wavelength conversion element 40 according to the present embodiment, the number of phosphor particles 431 having relatively small particle diameters present in a region close to the surface on which the excitation light E is incident is smaller than in the related art.

Since the area of the refractive index interfaces in a region close to the surface on which the excitation light E is incident is therefore smaller than in the related art, the ratio of the backscattered excitation light Er to the excitation light E is smaller than in the related art. As a result, a larger amount of excitation light E than in the related art is absorbed by the phosphor particles 431, whereby the wavelength conversion efficiency of the phosphor particles 431 can be increased. Further, the fluorescence Y is reflected in the wavelength conversion layer 43 by a smaller number of times than in the related art, whereby the amount of fluorescence Y reabsorbed by the activator can be reduced. As a result, the wavelength conversion element 40 according to the present embodiment allows an increase the fluorescence extraction efficiency. High-intensity fluorescence Y can therefore be produced.

In the present embodiment, since the substrate 44, which reflects the fluorescence Y, is provided on the second surface 43b of the wavelength conversion layer 43, a reflective wavelength conversion element capable of producing high-intensity fluorescence Y can be provided. Further, since the substrate 44 also serves as the reflection section, and no reflection layer therefore needs to be separately provided, the process of manufacturing the wavelength conversion element 40 can be simplified.

The present inventor actually has experimentally produced the wavelength conversion element according to the present embodiment and a wavelength conversion element according to Comparative Example and compared the light emission characteristics of the two wavelength conversion elements with each other.

The wavelength conversion element according to Comparative Example differs from the wavelength conversion element according to the present embodiment only in that the first and second regions are positionally reversed. That is, in the wavelength conversion element according to Comparative Example, a plurality of phosphor particles having a particle diameter distribution having a smaller minimum particle diameter are disposed on the side closer to the excitation light incident surface, and a plurality of phosphor particles having a particle diameter distribution having a greater minimum particle diameter are disposed on the side farther to the excitation light incident surface.

Figure 6:
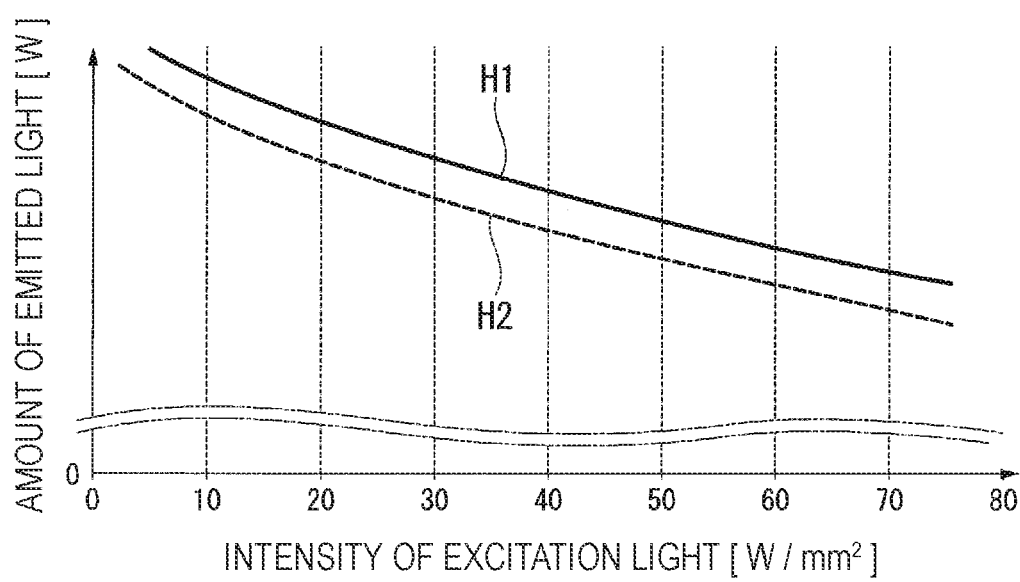
FIG. 6 shows graphs illustrating the relationship between the intensity of excitation light and the amount of emitted light.

FIG. 6 shows graphs illustrating the relationship between the intensity of the excitation light and the amount of emitted light.

The horizontal axis of FIG. 6 represents the intensity of the excitation light [W/mm$^2$], and the vertical axis of FIG. 6 represents the amount of emitted light (relative value). A solid-line graph H1 represents data relating to the wavelength conversion element according to the present embodiment, and a broken-line graph H2 represents data relating to the wavelength conversion element according to Comparative Example.

FIG. 6 demonstrates that in a case where the wavelength conversion layers are irradiated with excitation light having the same intensity, the wavelength conversion element according to the present embodiment produces a larger amount of fluorescence than the wavelength conversion element according to Comparative Example.

The first light source apparatus 100 in the present embodiment includes the wavelength conversion element 40 described above and can therefore produce high-intensity output light.

The projector 1 according to the present embodiment includes the first light source apparatus 100 described above and can therefore project light having a high luminous flux.

The technical range of the invention is not limited to the embodiment described above, and a variety of changes can be made thereto to the extent that the changes do not depart from the substance of the invention.

For example, the aforementioned embodiment has been described with reference to the case where the light source apparatus (first light source apparatus 100) includes the wavelength converter including the wavelength conversion element and the motor. The configuration described above may be replaced with a configuration in which the light source apparatus includes no motor but includes the wavelength conversion element. That is, the light source apparatus may be configured to include a stationary wavelength conversion element. Further, as the excitation light source, the semiconductor laser that emits blue excitation light may be replaced with a light emitting diode (LED) that emits blue excitation light.

In addition, the number, shape, material, arrangement, and other factors of each of the components that form the wavelength conversion element and the light source apparatus can be changed as appropriate. In the embodiment described above, the projector including the three light modulators is presented by way of example. Instead, the invention is also applicable to a projector that displays color video images via a single light modulator. Further, as each of the light modulators, the liquid crystal panel described above is not necessarily used, and a digital mirror device can, for example, be used.

The shape, number, arrangement, material, and other factors of each of a variety of components of the projector are not limited to those in the embodiment described above and can be changed as appropriate.

Further, the case where the light source apparatus according to the embodiment of the invention is incorporated in a projector is presented in the embodiment described above, but not necessarily. The light source apparatus according to the embodiment of the invention can also be used, for example, in a lighting apparatus and an automobile headlight.

The entire disclosure of Japanese Patent Application No. 2017-170934, filed on Sep. 6, 2017 is expressly incorporated by reference herein.

What is claimed is:

1. A wavelength conversion element comprising:
    a wavelength conversion layer having:
        a first surface configured to receive excitation light incident thereon;
        a second surface located on a side opposite the first surface;
        a plurality of phosphor particles including YAG and Ce configured to convert a wavelength of the excitation light to produce fluorescence;
        a binder that holds the plurality of phosphor particles;
        a first region that contains a first portion of the phosphor particles and is located on a side of the wavelength conversion layer facing the first surface, a peak of a particle diameter distribution of the first portion of the phosphor particles being greater than 20 µm; and
        a second region that contains a second portion of the phosphor particles and is located on a side of the wavelength conversion layer facing the second surface, a peak of a particle diameter distribution of the second portion of the phosphor particles being less than 20 µm,
    wherein a total surface area of the first portion of the phosphor particles is smaller than a total surface area of the second portion of the phosphor particles, and the wavelength conversion element is configured to produce fluorescence when the excitation light has an intensity of 10 W/mm$^2$ or more.

2. The wavelength conversion element according to claim 1, further comprising:
    a reflector configured to reflect the fluorescence and that faces the second surface.

3. A light source apparatus comprising:
    the wavelength conversion element according to claim 2; and
    an excitation light source configured to output the excitation light.

4. A projector comprising:
    the light source apparatus according to claim 3;
    a light modulator configured to modulate light from the light source apparatus according to image information to form image light; and
    a projection optical apparatus that projects the image light.

5. A light source apparatus comprising:
    the wavelength conversion element according to claim 1; and
    an excitation light source configured to output the excitation light.

6. A projector comprising:
    the light source apparatus according to claim 5;
    a light modulator configured to modulate light from the light source apparatus according to image information to form image light; and
    a projection optical apparatus configured to project the image light.

7. A method for manufacturing a wavelength conversion element including:
    providing a plurality of phosphor particles including YAG and Ce;
    classifying the plurality of phosphor particles into a first group having a peak of a particle diameter distribution thereof of greater than 20 µm, and a second group having a peak of a particle diameter distribution thereof of less than 20 µm;
    mixing the first group of phosphor particles with a binder material to produce a first wavelength conversion layer;
    mixing the second group of phosphor particles with the binder material separately from the first group to produce a second wavelength conversion layer;
    applying the second wavelength conversion layer onto a substrate;
    applying the first wavelength conversion layer onto the second wavelength conversion layer opposite the substrate, the first wavelength conversion layer having a first surface configured to receive excitation light incident thereon; and
    integrating the first wavelength conversion layer and the second wavelength conversion layer to produce a single wavelength conversion layer, wherein a total surface area of the first group of the phosphor particles is smaller than a total surface area of the second group of the phosphor particles, and the wavelength conversion element is configured to produce fluorescence when the excitation light has an intensity of 10 W/mm$^2$ or more.

8. A method for manufacturing a light source apparatus, comprising:

performing the method for manufacturing the wavelength conversion element of claim 7; and providing an excitation light source configured to output the excitation light onto the first surface of the first wavelength conversion layer.

\* \* \* \* \*